US010312909B2

(12) United States Patent
Huang et al.

(10) Patent No.: US 10,312,909 B2
(45) Date of Patent: Jun. 4, 2019

(54) INPUT DEVICE AND INPUT OPERATION METHOD THEREOF

(71) Applicant: SHENZHEN LICHI CREATIVE TECHNOLOGY LTD, Shenzhen (CN)

(72) Inventors: Jianan Huang, GuangXi (CN); Kan Li, GuangXi (CN)

(73) Assignee: SHENZHEN LICHI CREATIVE TECHNOLOGY LTD, Shenzhen (CN)

( * ) Notice: Subject to any disclaimer, the term of this patent is extended or adjusted under 35 U.S.C. 154(b) by 0 days.

(21) Appl. No.: 15/544,026

(22) PCT Filed: Dec. 6, 2015

(86) PCT No.: PCT/CN2015/096503
§ 371 (c)(1),
(2) Date: Jul. 17, 2017

(87) PCT Pub. No.: WO2016/115946
PCT Pub. Date: Jul. 28, 2016

(65) Prior Publication Data
US 2018/0006649 A1    Jan. 4, 2018

(30) Foreign Application Priority Data
Jan. 19, 2015 (CN) .......................... 2015 1 0027012

(51) Int. Cl.
*G06F 3/044* (2006.01)
*H03K 17/98* (2006.01)
(Continued)

(52) U.S. Cl.
CPC ........... *H03K 17/98* (2013.01); *G06F 3/0202* (2013.01); *G06F 3/03* (2013.01); *G06F 3/044* (2013.01);
(Continued)

(58) Field of Classification Search
CPC ............ G06F 3/03; G06F 3/44; G06F 3/0202; H03K 17/962; H03K 17/9622
See application file for complete search history.

(56) References Cited

U.S. PATENT DOCUMENTS 4,090,229 A * 5/1978 Cencel .................. H03K 17/98
361/278
4,325,102 A * 4/1982 English ................ H03K 17/975
200/600
(Continued)

*Primary Examiner* — Andrew W Bee
(74) *Attorney, Agent, or Firm* — IPro, PLLC

(57) ABSTRACT

An input device, comprising an input interface, an adjustable capacitor, a memory and a processor, wherein the input interface is abutted with the adjustable capacitors; the memory is electrically connected with the adjustable capacitor and the processor, respectively, the input interface is used for generating pressing signals after being physically pressed so as to change the capacitance of the adjustable capacitor, the adjustable capacitor is used for correspondingly responding to the pressing signals of the input interface and outputting the capacitance changing signals, the memory is used for receiving the capacitance changing signals of the adjustable capacitor and finding corresponding output signals from the look-up table pre-stored in the memory; and the processor is used for receiving the output signals of the memory and feeding back the first input signal or the second input signal.

14 Claims, 6 Drawing Sheets

(51) Int. Cl.
  *G06F 3/03* (2006.01)
  *H03K 17/96* (2006.01)
  *H03K 17/967* (2006.01)
  *G06F 3/02* (2006.01)
  *H03K 17/975* (2006.01)

(52) U.S. Cl.
  CPC ......... *H03K 17/962* (2013.01); *H03K 17/967* (2013.01); *H03K 17/975* (2013.01); *H03K 2217/9653* (2013.01)

(56) References Cited

U.S. PATENT DOCUMENTS

| | | | |
|---|---|---|---|
| 4,849,852 A * | 7/1989 | Mullins | H01G 5/0138 200/517 |
| 2008/0196945 A1* | 8/2008 | Konstas | G06F 3/03547 178/18.03 |
| 2010/0321301 A1* | 12/2010 | Casparian | G06F 3/016 345/168 |
| 2012/0299832 A1* | 11/2012 | Peterson | G06F 3/0202 345/168 |
| 2014/0253506 A1* | 9/2014 | Leung | G06F 1/1616 345/174 |
| 2014/0354577 A1* | 12/2014 | Hanssen | G06F 3/044 345/174 |

* cited by examiner

INPUT DEVICE AND INPUT OPERATION METHOD THEREOF

FIELD OF THE DISCLOSURE

The present disclosure generally relates to input device, and more particularly, to a keyboard and operation method thereof.

BACKGROUND

Along with the development of modern electronic technology, electronic products are gradually getting deeper into people's lives. The daily lives of people are accompanied by all kinds of electronic products, such as telephones, mobile phones, notebook computers and remote controllers.

The input devices of the electronic products mentioned above play an especially important role. The input device in the prior art, no matter whether it was a resistance type or a capacitance type, almost only outputs the corresponding operating signals when being touched. In other words, once a user touches the touch-type input device, the touch-type input device outputs a control signal to a terminal device for the corresponding operation rather than judging if it is a mistaken touch signal. As a result, when using the touch-type input device, the user needs to enable the hands per se to be suspended in the air to prevent the wrists or palms from touching or being placed on the touch region of the touch-type input device resulting in misoperation. Thus, the operational convenience of the touch-type input device is reduced.

Firstly, the input device in the prior art mainly adopts a thin-film switch as the component for pressing the switch. When a key is pressed, the key moves downwards and applies pressure to the thin-film switch to drive breakover of the thin-film switch per se and to convert a physical mechanical input signal into an electronic input signal, thereby realizing input operation. However, breakover cannot be realized without repeated mutual contact between the polar plates of the mechanical key switch, so mutual frictional loss of the polar plates results, the key reliability is reduced and the service life is shortened. Meanwhile, cost is increased as materials with good electric conductivity such as gold and silver need to be arranged on the surfaces of the polar plates for improving the pressing sensitivity.

Compared with the prior art, the input device and the input operation method thereof provided by the invention have the beneficial effects that:

As the memory and the processor feedback input signals based on the capacitance changing signals of the adjustable capacitor, misoperation caused by mistakenly touching the input device by the operator can be avoided, and the input operation reliability of the input device is accordingly improved. Furthermore, as the operator can place their fingers on the input device in a most comfortable way which accords with human engineering when using the input device, the input operation convenience of the input device is guaranteed.

Secondly, as the distance or the direct-facing area between the coupled polar plates of the adjustable capacitor is delivered and adjusted through mechanical pressing, frictional loss between the polar plates is avoided, the reliability of the adjustable capacitor is guaranteed efficiently, and the product yield and the service life are improved.

In addition, as the polar plates of the adjustable capacitor are coupled, touch between the polar plates is unnecessary, no friction exists, a good conductor with relatively high cost is unnecessary, and the cost is further reduced.

BRIEF DESCRIPTION OF THE DRAWINGS

Many aspects of the embodiments can be better understood with reference to the following drawings. The components in the drawing are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

The present disclosure will be described in detail below with reference to the attached drawings and embodiments thereof.

Figure 1:
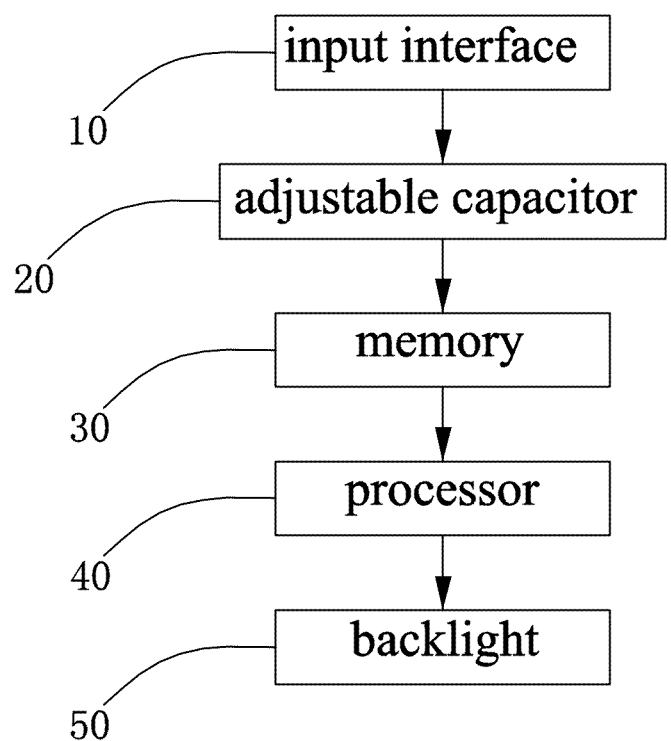
FIG. 1 is a block diagram of a signal input process of a preferred embodiment of the input device provided by the invention.

Please refer to FIG. 1, a block diagram of a signal input process of a preferred embodiment of the input device provided by the invention. The input device comprises an input interface 10, an adjustable capacitor 20, a memory 30, a processor 40 and a backlight unit 50.

The input interface 10 is in direct contact with an input operator; and pressing signals are generated when the input interface 10 is physically pressed and the delivered pressing force moves up and down in the vertical direction along with the pressing effect of the input operator.

The adjustable capacitor 20 is abutted with the lower end of the input interface 10; and the capacitance of the capacitor 20 changes after the capacitor 20 is subjected to the pressing force of the input interface 10. The adjustable capacitor 20 correspondingly responds to the pressing signals of the input interface 10 and outputs the capacitance changing signals.

The memory 30 is electrically connected with the adjustable capacitor 20 and the processor 40, respectively. A look-up table is pre-stored in the memory 30 and the memory 30 receives the capacitance value changing signals of the adjustable capacitor 20 and correspondingly finds the corresponding output signals from the look-up table. In the look-up table, the capacitance value changing signals in a certain range can be set to correspond to an output signal, for example, if [delta]C is greater than or equal to 0 but less than or equal to 1F, the corresponding output signal is zero; and if the [delta]C is greater than or equal to 1F but less than or equal to 2F, the corresponding output signal is 1; and [delta]C is the capacitance changing value of the adjustable capacitor 20. Of course, one capacitance changing value also can be set to correspond to one output signal.

The processor 40 receives the output signals of the memory 30 and feeds back a first input signal or a second input signal, that is, it judges whether the output signals of the memory 30 are effective output signals. In the embodiment, when the output signals is set as zero, the processor 40 feeds back the first input signal, that is, no input signal is generated, and the input of the input device is invalid; when the output signal is set as 1, the processor 40 feeds back the second input signal, that is, the input signal is generated, and the input of the input device is effective.

The backlight unit 50 is electrically connected with the processor 40. The backlight unit 50 performs color development based on the first input signal or the second input signal fed back by the processor 40. In the embodiment, when the processor 40 feeds back the first input signal, the backlight unit 50 does not perform the color development, and when the processor 40 feeds back the second input signal, the backlight unit 50 performs the color development to remind the input operator that the input operation is an effective input.

In addition, the processor 40 also can be electrically connected with an external output end (not shown in the Fig.). The external output end outputs its signal based on the first input signal or the second input signal fed back by the processor 40. The external output end can be a personal computer or a mobile phone.

Figure 2:
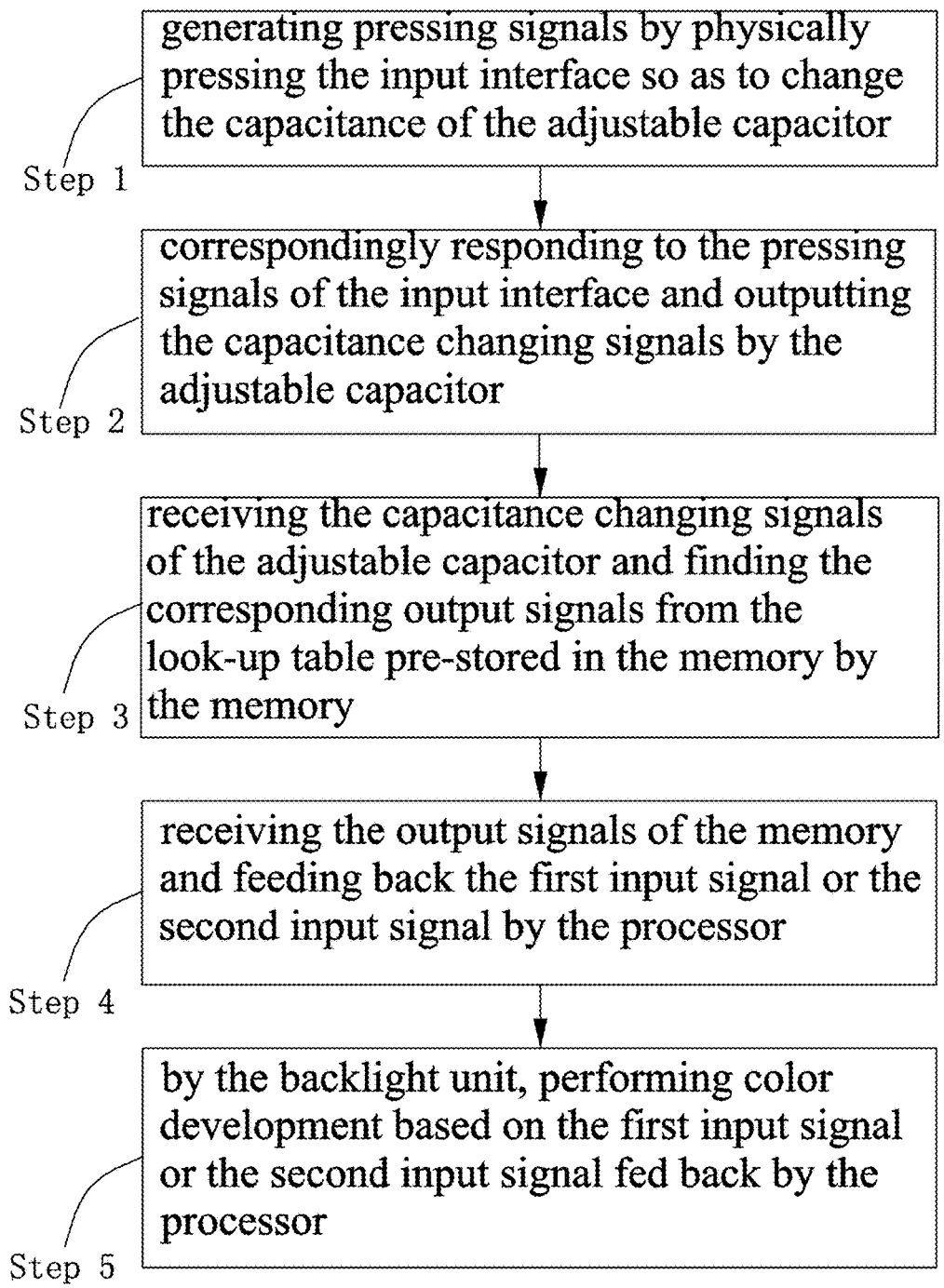
FIG. 2 is the process schematic diagram of the input operation method of the input device shown in the FIG. 1.

Please refer to FIG. 2, the process schematic diagram of the input operation method of the input device shown in the FIG. 1. The input operation method comprises the following steps:

step S1: generating pressing signals by physically pressing the input interface 10 so as to change the capacitance of the adjustable capacitor 20;

step S2: correspondingly responding to the pressing signals of the input interface 10 and outputting the capacitance changing signals by the adjustable capacitor 20;

step S3: receiving the capacitance changing signals of the adjustable capacitor 20 and finding the corresponding output signals from the look-up table pre-stored in the memory 30 by the memory 30;

step S4: receiving the output signals of the memory 30 and feeding back the first input signal or the second input signal by the processor 40; and step S5: by the backlight unit 50, performing color development based on the first input signal or the second input signal fed back by the processor 40.

Based on the concept of the capacitor, the capacitance value generally represents the ability thereof of containing electric charges. When the capacitance value is shown by the letter C, the capacitance value C of the capacitor is equal to $\epsilon S/4\pi kd$, wherein d is the distance between polar plates, S is the direct-facing area of each polar plate, $\epsilon$ is a dielectric constant, and k is an electrostatic constant. Therefore, in step S1, the main factors for the change of the capacitance of the adjustable capacitor 20 are the distance d between the polar plates and the direct-facing area S of each polar plate. The input operation method of the input device will be described simply below from the above two factors.

Embodiment 1

Figure 3:
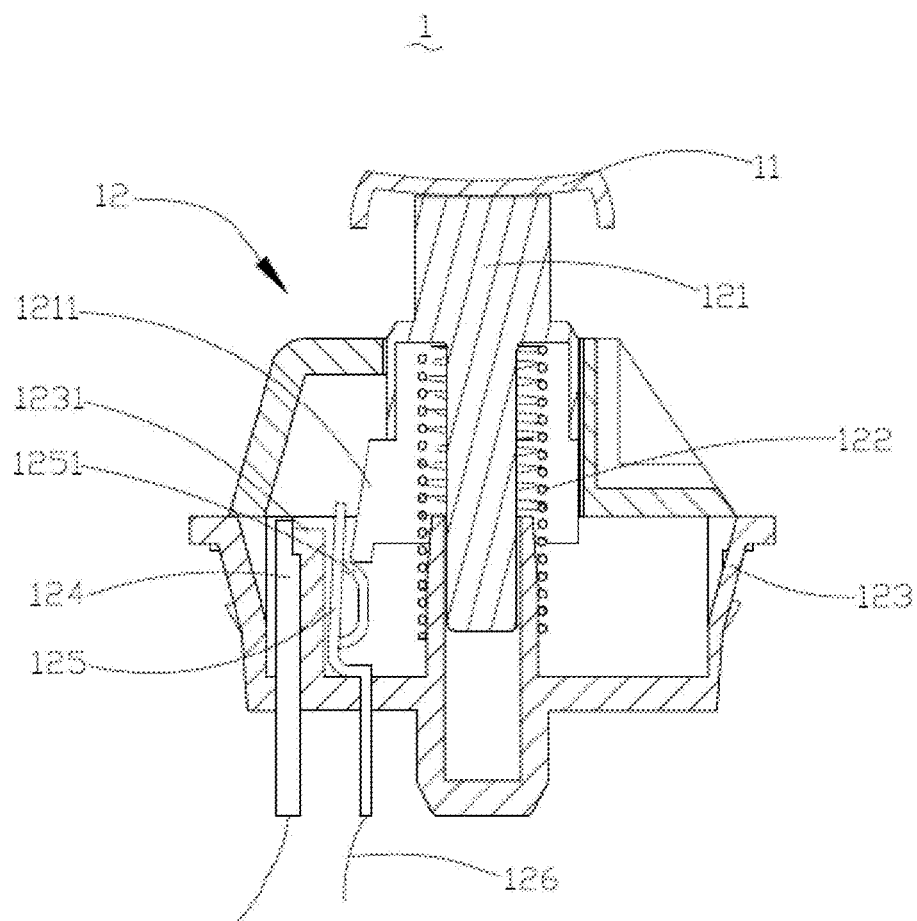
FIG. 3 is a profile section view of the embodiment 1 of the input device shown in the FIG. 1.

Please refer to FIG. 3, a profile section view of the embodiment 1 of the input device shown in the FIG. 1. The input device 1 comprises an input interface 11, an adjustable capacitor 12, a memory (not shown in the FIG.), a processor (not shown in the FIG.) and a backlight unit (not shown in the FIG.).

The input interface 10 is in direct contact with the input operator; and pressing signals are generated when the input interface 10 is physically pressed and the delivered pressing force moves up and down in the vertical direction along with the pressing effect of the input operator.

The adjustable capacitor 12 comprises a lead column 121, an elastic body 122, a frame 123, a first polar plate 124, a second polar plate 125 and a conducting circuit 126.

The whole lead column 121 is a long column, one end thereof is abutted with the inner surface of the input interface 11 while the other end thereof is suspended and is contained in the frame 123.

The lead column 121 comprises a bulge 1211. The bulge 1211 is formed by extending the side surface of the lead column 121 and is arranged at the intermediate height position of the lead column 121.

The bulge 1211 and the lead column 121 can be of an integral structure, and the bulge 1211 also can be an independent component of the lead column 121.

The elastic body 122 is a stainless steel spring sleeved at the outside of the lead column 121. The frame 123 supports one end of the elastic body 122 while the other end of the elastic body 122 is abutted with the lead column 121; that is to say, the elastic body 122 is clamped between the frame 123 and the lead column 121.

When the lead column 121, under the action of the input interface 11, moves towards the frame 123, the elastic body 122 is driven to be in a compressed state; when the acting force applied to the lead column 121 disappears, the elastic body 122 drives the lead column 121 to move far away from the frame 123 under the action of the elastic deformation thereof; that is to say, the lead column 121 performs a reciprocating motion with respect to the frame 123.

The frame 123 comprises an insulator 1231; and the insulator 1231 is formed by extending the bottom plate of the frame 123.

The first polar plate 124 and the second polar plate 125 are arranged oppositely in a coupling manner and at intervals. One end of the first polar plate 124 and one end of the second polar plate 125 are respectively fixed at the frame 123; the other ends thereof are respectively arranged in a manner of extending far away from the frame 123; and the insulator 1231 of the frame 123 is clamped between the first polar plate 124 and the second polar plate 125.

The second polar plate 125 comprises abutting ends 1251. The abutting ends 1251 are formed by extending from one end of the second polar plate to the side far away from the first polar plate 124 and are elastically butted with the bulge 1211 of the lead column 121. The first polar plate 124 is fixedly arranged with respect to the lead column 121; and the second polar plate 125 is clamped between the first polar plate 124 and the lead column 121.

The conducting circuit 126 is a wire used for transmitting the capacitance changing signals of the adjustable capacitor 12; one end of the conducting circuit 126 is respectively connected with one end of the first polar plate 124 and one end of the second polar plate 125; and the other end is correspondingly connected with the memory.

The memory is electrically connected with the adjustable capacitor 12 and the processor, respectively; and the backlight unit is electrically connected with the processor.

The input operation method of the input device 1 comprises the following steps:

step S11: generating pressing signals by physically pressing the input interface 11 so as to change the capacitance of the adjustable capacitor 12, wherein the pressing signals are the pressing force.

step S12: correspondingly responding to the pressing signals of the input interface 11 and outputting the capacitance changing signals by the adjustable capacitor 12, wherein the specific process of correspondingly responding to the pressing signals of the input interface 11 by the adjustable capacitor 12 is as follows:

the input interface 11 delivers the pressing signals to the lead column 121; the lead column 121 moves downwards towards the frame 123; the bulge 1211 of the lead column 121 delivers the pressing signals to the abutting ends 1251 of the second polar plate 125 to drive the second polar plate 125 to move rotationally towards the direction close to the first polar plate 124; the center of the circle of the rotation is the intersection point of the second polar plate 125 and the frame 123, so that the distance between the first polar plate 124 and the second polar plate 125 changes; when the acting force from the bulge 1211 to the abutting ends 1251 is removed, the elastic deformation characteristic of the second polar plate 125 drives the second polar plate 125 to recover the state before the force is applied; that is to say, the second polar plate 125 moves rotationally towards the direction far away from the first polar plate 124.

In other words, as the height of the first polar plate 124 is smaller than that of the second polar plate 125, the projection of the first polar plate 124 is always in the plane where the second polar plate 125 is; that is to say, when the second polar plate 125 moves rotationally, the relative area S between the first polar plate 124 and the second polar plate 125 is unchanged, and the capacitance C of the adjustable capacitor 12 changes correspondingly along with the distance d between the first polar plate 124 and the second polar plate 125. Therefore, the change of the capacitance value is realized, and the capacitance changing signals are output.

step S13: receiving the capacitance changing signals of the adjustable capacitor 12 and finding corresponding output signals from the look-up table pre-stored in the memory by the memory;

step S14: receiving the output signals of the memory and feeding back the first input signal or the second input signal by the processor; and step S15: by the backlight unit, performing color development based on the first input signal or the second input signal fed back by the processor.

Embodiment 2

Figure 4:
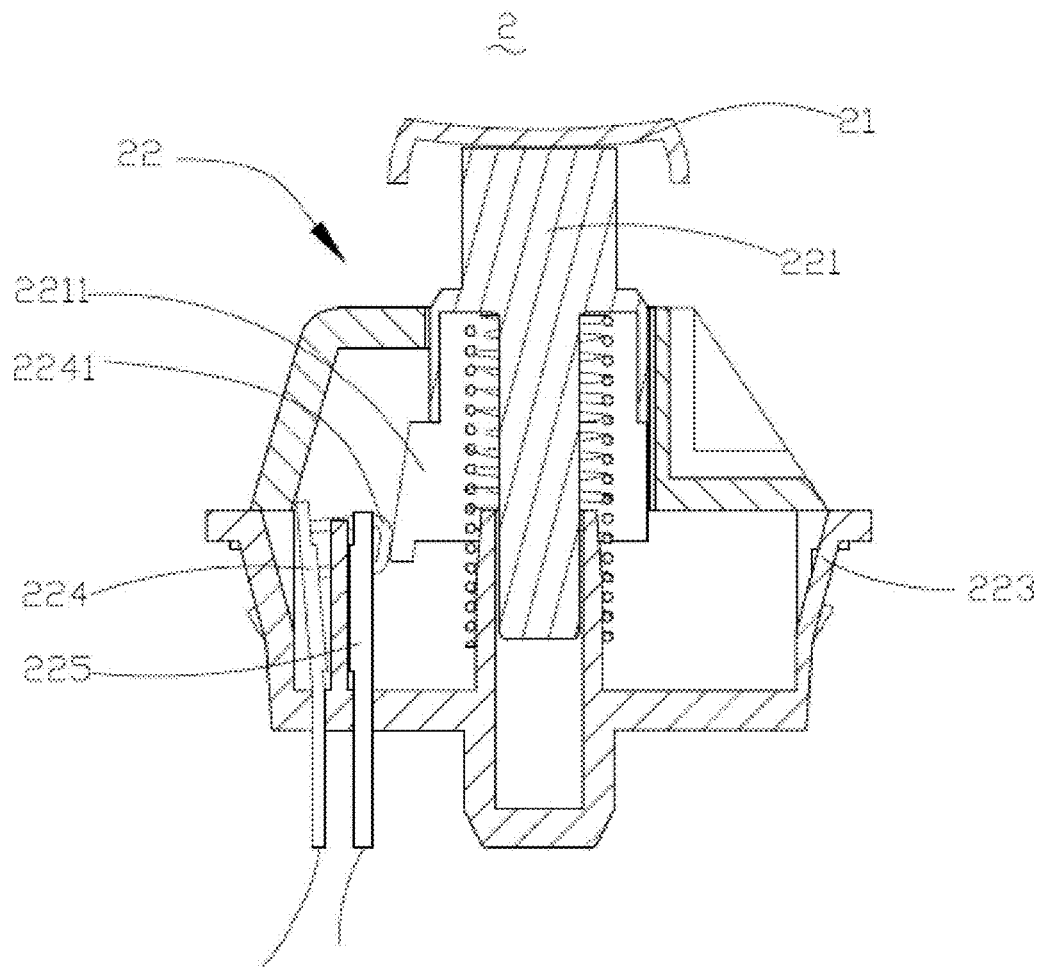
FIG. 4 is a profile section view of the embodiment 2 of the input device shown in the FIG. 1.

Please refer to FIG. 4, a profile section view of the embodiment 2 of the input device shown in the FIG. 1.

The difference between the embodiment 2 and the embodiment 1 is that, in the input device 2 provided by the embodiment, the height of the second polar plate 225 is smaller than that of the first polar plate 224, and the first polar plate 224 comprises the abutting ends 2241. The abutting ends 2241 are formed by extending from one end of the first polar plate 224. The second polar plate 225 comprises a nick (not shown in the Fig.); the nick is of a hollow structure formed at the middle part of the second polar plate 225. Each abutting end 2241 penetrates the nick of the second polar plate 225 and is arranged in a way of extending towards the lead column 221. The second polar plate 225 is clamped between the first polar plate 224 and the lead column 221 and is arranged fixedly with respect to the lead column 221; and each abutting end 2241 is elastically abutted with the bulge 2211 of the lead column 221.

The input operation method of the input device 2 comprises the following steps:

step S21: generating pressing signals by physically pressing the input interface 21 so as to change the capacitance of the adjustable capacitor 22, wherein the pressing signals are the pressing force.

step S22: correspondingly responding to the pressing signals of the input interface 21 and outputting the capacitance changing signals by the adjustable capacitor 22, wherein the specific process of correspondingly responding to the pressing signals of the input interface 21 by the adjustable capacitor 22 is as follows:

the input interface 21 delivers the pressing signals to the lead column 221; the lead column 221 moves downwards towards the frame 223; the bulge 2211 of the lead column 221 delivers the pressing signals to the abutting ends 2241 of the first polar plate 224 to drive the first polar plate 224 to move rotationally towards the direction far away from the second polar plate 225; the center of the circle of the rotation is the intersection point of the first polar plate 224 and the frame 223, so that the distance between the second polar plate 225 and the first polar plate 224 changes; when the acting force from the bulge 2211 to the abutting ends 2241 is removed, the elastic deformation characteristic of first polar plate 224 drives the first polar plate 224 to recover the state before the force is applied; that is to say, the first polar plate 224 moves rotationally towards the direction close to the first polar plate 224.

In other words, as the height of the second polar plate 225 is smaller than that of the first polar plate 224, the relative area S between the second polar plate 225 and the first polar plate 224 is unchanged when the first polar plate 224 moves rotationally, and the capacitance C of the adjustable capacitor 22 changes correspondingly along with the distance d between the first polar plate 224 and the second polar plate 225. Therefore, the change of the capacitance value is realized, and the capacitance changing signals are output.

step S23: receiving the capacitance changing signals of the adjustable capacitor 22 and finding corresponding output signals from the look-up table pre-stored in the memory by the memory;

step S24: receiving the output signals of the memory and feeding back the first input signal or the second input signal by the processor; and step S25: by the backlight unit, performing color development based on the first input signal or the second input signal fed back by the processor.

Embodiments 3

Figure 5:
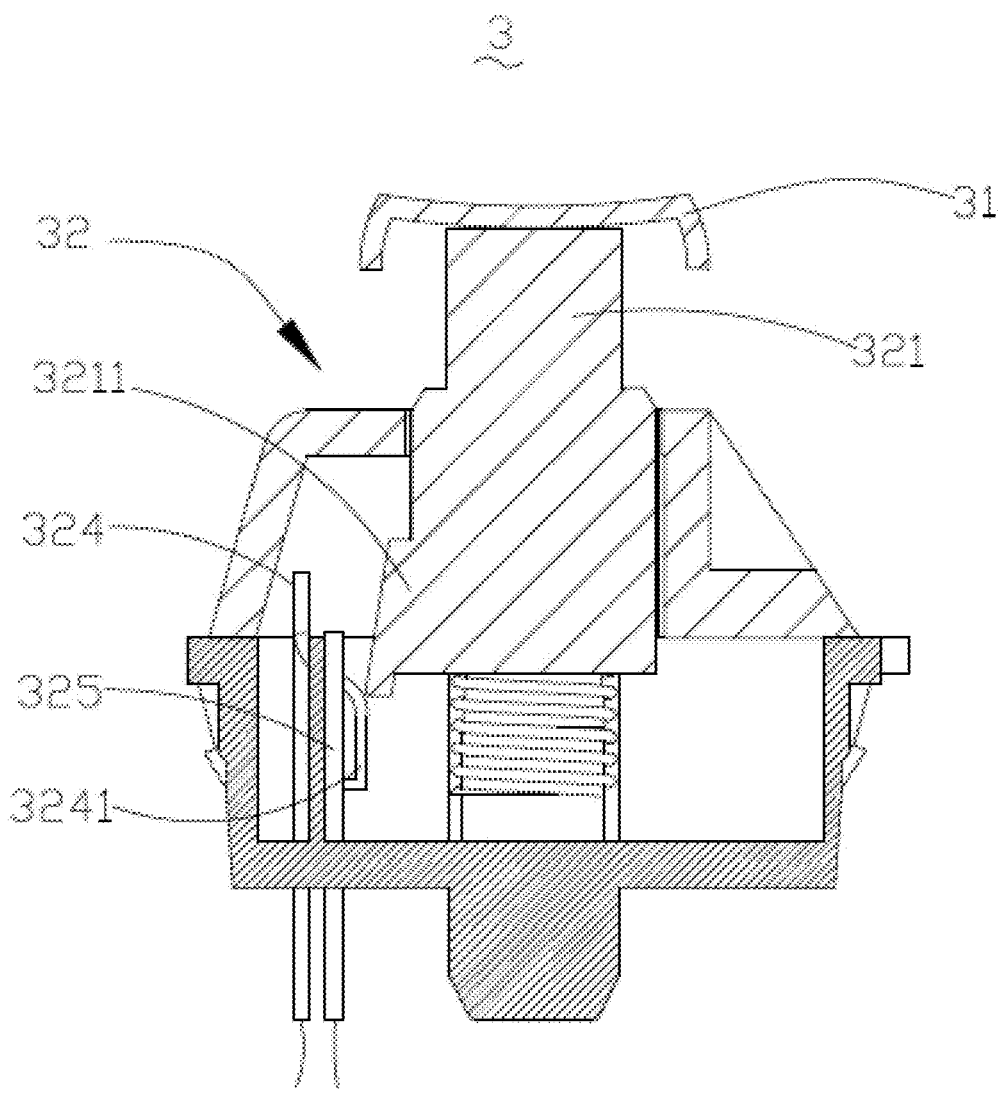
FIG. 5 is a profile section view of the embodiment 3 of the input device shown in the FIG. 1.

Please refer to FIG. 5, a profile section view of the embodiment 3 of the input device shown in the FIG. 1. The input device 3 comprises an input interface 31, an adjustable capacitor 32, a memory (not shown in the FIG.), a processor (not shown in the FIG.) and a backlight unit (not shown in the FIG.).

The difference between the embodiment 3 and the embodiment 2 is that, in the input device 3 provided by the embodiment, the first polar plate 324 comprises two symmetrically arranged abutting ends 3241. The abutting ends 3241 are formed by extending the middle part of the first polar plate 324.

The second polar plate 325 comprises a nick (not shown in the FIG.); the nick is of a hollow structure formed at the middle part of the second polar plate 325. Each abutting end 3241 penetrates the nick of the second polar plate 325 and is arranged to extend towards the lead column 321. The second polar plate 325 is clamped between the first polar plate 324 and the lead column 321 and is arranged fixedly with respect to the lead column 321; and the abutting ends 3241 are elastically abutted with the bulge 3211 of the lead column 321.

Embodiment 4

Figure 6:
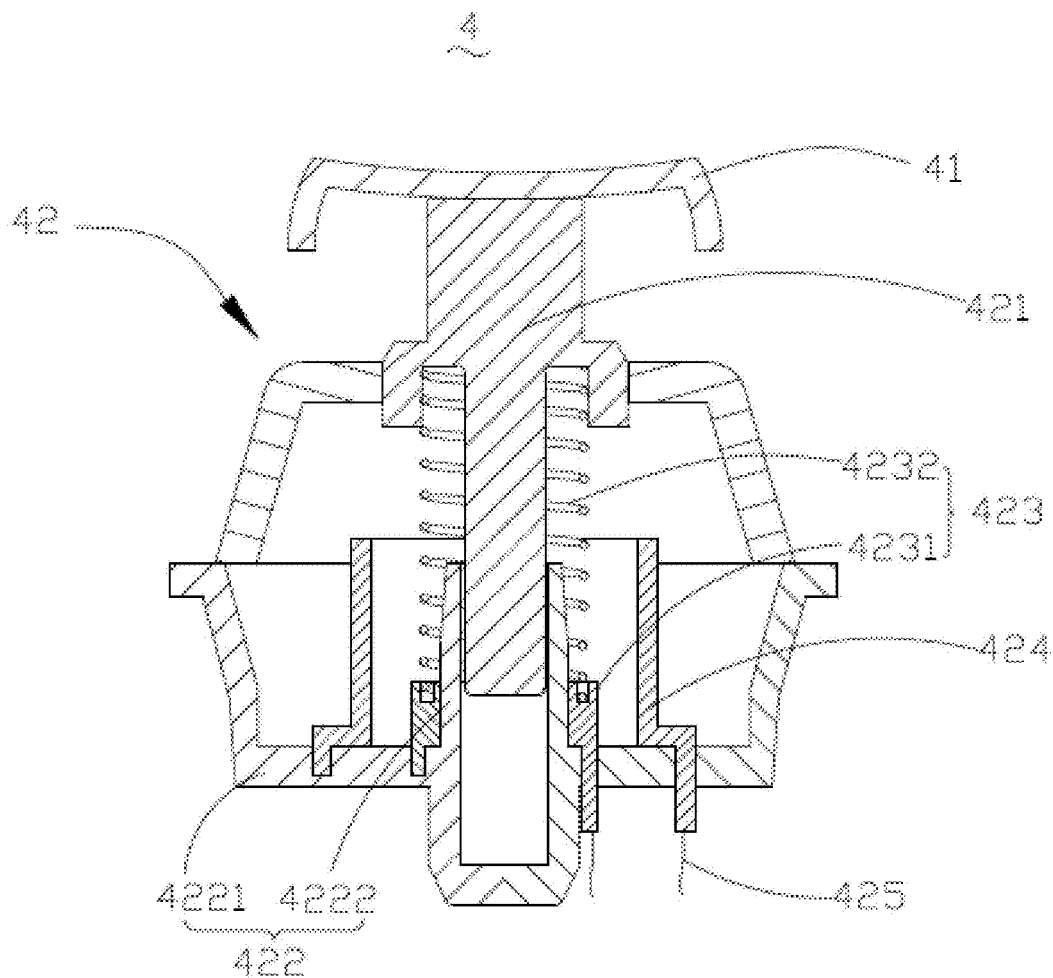
FIG. 6 is a profile section view of the embodiment 4 of the input device shown in the FIG. 1

Please refer to FIG. 6, a profile section view of the embodiment 4 of the input device shown in the FIG. 1. The input device 4 comprises an input interface 41, an adjustable capacitor 42, a memory (not shown in the FIG.), a processor (not shown in the FIG.) and a backlight unit (not shown in the FIG.).

The input interface 41 is in direct contact with the input operator; and pressing signals are generated when the input interface 41 is physically pressed and the delivered pressing force moves up and down in the vertical direction along with the pressing effect of the input operator.

The adjustable capacitor 42 comprises a lead column 421, a frame 422, a polar plate 423, a second polar plate 424 and a conducting circuit 425.

The whole lead column 421 is a long column, one end thereof is abutted with the inner surface of the input interface 41 while the other end thereof is suspended and is contained in the frame 422.

The frame 422 comprises a bottom plate 4221 and a hollow lead tube 4222. The lead tube 4222 is arranged at the center of the bottom plate 422. The lead column 421 is partially inserted into the lead tube 4222. The lead column 421 performs a reciprocating motion with respect to the frame 422.

The first polar plate 423 and the second polar plate 424 are arranged oppositely in a coupling manner and at intervals on the frame 422.

The first polar plate 423 comprises a main body part 4231 and an elastic body 4232. The main body part 4231 and the second polar plate 424 are the same in structure and are hollow cylinders; and the outer diameter of the main body part 4231 is smaller than the inner diameter of the second polar plate 424, and the height of the main body part 4231 is smaller than that of the second polar plate 424.

The main body part 4231 is tightly sleeved at the outside of the lead tube 4222 and is fixed with the bottom plate 4221; the second polar plate 424 is also sleeve at the outside of the lead tube 4222, but has a certain distance to the main body part 4231; and the lower end of the second polar plate 424 is fixed at the bottom plate 4221 of the frame 422. The top end of the main body part 4231 is provided with a groove (without label).

The elastic body 4232 is a stainless steel spring sleeved at the outsides of both the lead column 421 and the lead tube 4222; and the upper end of the spring is abutted with the lead column 421 while the lower end thereof is clamped in the groove of the main body part 4231 so as to be tightly connected with the main body part 4231. The elastic body 4232 is fixedly connected with the main body part 4231 to form the first polar plate 423 which is arranged to be coupled with the second polar plate 424 at intervals.

The conducting circuit 425 is a wire used for transmitting the capacitance changing signals of the adjustable capacitor 42; one end of the conducting circuit 425 is respectively connected with one end of the first polar plate 423 and one end of the second polar plate 424; and the other end of the conducting circuit 425 is correspondingly connected with the memory.

The memory is electrically connected with the adjustable capacitor 42 and the processor, respectively; and the backlight unit is electrically connected with the processor.

The input operation method of the input device 4 comprises the following steps:

step S41: generating pressing signals by physically pressing the input interface 41 so as to change the capacitance of the adjustable capacitor 42, wherein the pressing signals are the pressing force.

step S42: correspondingly responding to the pressing signals of the input interface 41 and outputting the capacitance changing signals by the adjustable capacitor 42, wherein the specific process of correspondingly responding to the pressing signals of the input interface 41 by the adjustable capacitor 42 is as follows:

the input interface 41 delivers the pressing signals to the lead column 421 and moves downwards towards the frame 422; as the lead column 421 delivers the acting force to the elastic body 4232, the elastic body 4232 is compressed and deformed, resulting in an increase of the direct-facing area between the first polar plate 423 and the second polar plate 424. When the acting force applied to the elastic body 4232 by the lead column 421 is removed, the elastic deformation characteristic of the elastic body 4232 drives the elastic body 4232 to recover to the state before the force was applied, and the direct-facing area between the first polar plate 423 and the second polar plate 424 is accordingly reduced.

In other words, as the distance d between the first polar plate 423 and the second polar plate 424 is unchanged, the capacitance C of the adjustable capacitor 42 changes correspondingly along with the direct-facing area S between the first polar plate 423 and the second polar plate 424. Therefore, the change of the capacitance value is realized, and the capacitance changing signals are output.

step S43: receiving the capacitance changing signals of the adjustable capacitor 42 and finding corresponding output signals from the look-up table pre-stored in the memory by the memory;

step S44: receiving the output signals of the memory and feeding back the first input signal or the second input signal by the processor; and step S45: by the backlight unit, performing color development based on the first input signal or the second input signal fed back by the processor.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An input device, comprising an input interface, an adjustable capacitor, a memory and a processor, wherein the input interface is abutted with the adjustable capacitor; the memory is electrically connected with the adjustable capacitor and the processor, respectively;

the input interface is used for generating pressing signals by being physically pressed so as to change the capacitance of the adjustable capacitor;

the adjustable capacitor is used for correspondingly responding to the pressing signals of the input interface and outputting capacitance changing signals;

the memory is used for receiving the capacitance changing signals of the adjustable capacitor and finding corresponding output signals from a look-up table pre-stored in the memory; and the processor is used for receiving the output signals of the memory and feeding back a first input signal or a second input signal, wherein, the adjustable capacitor comprises a frame, a first capacitor plate and a second capacitor plate, wherein, one end of the first capacitor plate and one end of the second capacitor plate are respectively fixed at the frame, and the other end of the first capacitor plate and the other end of the second capacitor plate are respectively arranged in a manner of extending away from the frame;

wherein the adjustable capacitor further comprises a lead column; the lead column comprises a bulge; the first capacitor plate is fixedly arranged with respect to the lead column; the second capacitor plate comprises abutting ends abutted with the bulge of the lead column; the second capacitor plate is clamped between the first capacitor plate and the lead column; the frame contains the lead column; and the lead column performs a reciprocating motion with respect to the frame.

2. The input device according to claim 1, wherein the first capacitor plate and the second capacitor plate are oppositely arranged in a coupling manner and at intervals, and the pressing signals result in a change of the distance between the first capacitor plate and the second capacitor plate, and further results in a change of the capacitance of the adjustable capacitor.

3. The input device according to claim 1, wherein each abutting end of the second capacitor plate is arranged at the middle part of the second capacitor plate and extends towards the lead column.

4. The input device according to claim 3, wherein the adjustable capacitor further comprises an elastic body sleeved at the outside of the lead column and clamped between the lead column and the frame.

5. The input device according to claim 4, wherein the elastic body is a stainless steel spring.

6. The input device according to claim 1, wherein the input device further comprises a backlight unit electrically connected with the processor; the backlight unit performs color development based on the first input signal or the second input signal fed back by the processor.

7. The input device according to claim 1, wherein the processor is also electrically connected with an external output end; and the external output end outputs based on the first input signal or the second input signal fed back by the processor.

8. The input device according to claim 1, wherein the first capacitor plate and the second capacitor plate are disposed laterally with respect to the direction of the reciprocating motion of the lead column.

9. An input device, comprising an input interface, an adjustable capacitor, a memory and a processor, wherein the input interface is abutted with the adjustable capacitor; the memory is electrically connected with the adjustable capacitor and the processor, respectively;

the input interface is used for generating pressing signals by being physically pressed so as to change the capacitance of the adjustable capacitor;

the adjustable capacitor is used for correspondingly responding to the pressing signals of the input interface and outputting capacitance changing signals;

the memory is used for receiving the capacitance changing signals of the adjustable capacitor and finding corresponding output signals from a look-up table pre-stored in the memory; and the processor is used for receiving the output signals of the memory and feeding back a first input signal or a second input signal, wherein, the adjustable capacitor comprises a frame, a first capacitor plate and a second capacitor plate, wherein, one end of the first capacitor plate and one end of the second capacitor plate are respectively fixed at the frame, and the other end of the first capacitor plate and the other end of the second capacitor plate are respectively arranged in a manner of extending away from the frame;

wherein the first capacitor plate and the second capacitor plate are oppositely arranged in a coupling manner and at intervals, and the pressing signals result in a change of the distance between the first capacitor plate and the second capacitor plate, and further results in a change of the capacitance of the adjustable capacitor;

wherein the adjustable capacitor further comprises a lead column; the lead column comprises a bulge; the first capacitor plate comprises abutting ends abutted with the bulge of the lead column; the second capacitor plate is clamped between the first capacitor plate and the lead column and is fixedly arranged with respect to the lead column; the frame contains the lead column; and the lead column performs a reciprocating motion with respect to the frame.

10. The input device according to claim 9, wherein each abutting end of the first capacitor plate extends from an end part of the first capacitor plate to the lead column and penetrates the second capacitor plate.

11. The input device according to claim 9, wherein the first capacitor plate is provided with two symmetrically arranged abutting ends; the abutting ends extend from a middle part of the first capacitor plate to the lead column and penetrate the second capacitor plate.

12. An input device, comprising an input interface, an adjustable capacitor, a memory and a processor, wherein the input interface is abutted with the adjustable capacitor; the memory is electrically connected with the adjustable capacitor and the processor, respectively;

the input interface is used for generating pressing signals by being physically pressed so as to change the capacitance of the adjustable capacitor;

the adjustable capacitor is used for correspondingly responding to the pressing signals of the input interface and outputting capacitance changing signals;

the memory is used for receiving the capacitance changing signals of the adjustable capacitor and finding corresponding output signals from a look-up table pre-stored in the memory; and the processor is used for receiving the output signals of the memory and feeding back a first input signal or a second input signal, wherein, the adjustable capacitor comprises a frame, a first capacitor plate and a second capacitor plate, wherein, one end of the first capacitor plate and one end of the second capacitor plate are respectively fixed at the frame, and the other end of the first capacitor plate and the other end of the second capacitor plate are respectively arranged in a manner of extending away from the frame;

wherein the first capacitor plate and the second capacitor plate are oppositely arranged in a coupling manner and at intervals, and the pressing signals result in a change of the direct-facing area between the first capacitor plate and the second capacitor plate, and further results in a change of the capacitance of the adjustable capacitor;

wherein the adjustable capacitor further comprises a lead column; the frame comprises a lead tube; the lead column is partially inserted into the lead tube; the lead column performs a reciprocating motion with respect to the frame; the first capacitor plate comprises a main body part and an elastic body; the main body part and the second capacitor plate are oppositely arranged at the outside of the lead tube at intervals; the elastic body is sleeved at the outsides of both the lead column and the lead tube; and the upper end of the elastic body is abutted with the lead column, and the lower end of the elastic body is fixedly connected with the main body part.

13. The input device according to claim 12, wherein the first capacitor plate and the second capacitor plate are shaped into hollow cylinders which are disposed concentrically with respect to the direction of the reciprocating motion of the lead column.

14. An input operation method of an input device, wherein the input device comprises an input interface, an adjustable capacitor, a memory and a processor; the input interface is abutted with the adjustable capacitor; the memory is electrically connected with the adjustable capacitor and the processor, respectively; the adjustable capacitor comprises a frame, a first capacitor plate and a second capacitor plate; one end of the first capacitor plate and one end of the second capacitor plate are respectively fixed at the frame, and the other end of the first capacitor plate and the other end of the second capacitor plate are respectively arranged in a manner of extending away from the frame; wherein the adjustable capacitor further comprises a lead column; the lead column comprises a bulge; the first capacitor plate is fixedly arranged with respect to the lead column; the second capacitor plate comprises abutting ends abutted with the bulge of the lead column; the second capacitor plate is clamped between the first capacitor plate and the lead column; the frame contains the lead column; and the lead column performs a reciprocating motion with respect to the frame; and the input operation method comprises the steps of:
generating pressing signals by physically pressing the input interface so as to change the capacitance of the adjustable capacitor;
correspondingly responding to the pressing signals of the input interface and outputting capacitance changing signals by the adjustable capacitor;
receiving the capacitance changing signals of the adjustable capacitor and finding corresponding output signals from a look-up table pre-stored in the memory by the memory; and
receiving the output signals of the memory and feeding back a first input signal or a second input signal by the processor.

* * * * *